(12) United States Patent
Yun (10) Patent No.: US 11,784,057 B2
(45) Date of Patent: Oct. 10, 2023

(54) SUBSTRATE PROCESSING APPARATUS, LINKED PROCESSING SYSTEM, AND SUBSTRATE PROCESSING METHOD

(71) Applicant: Tokyo Electron Limited, Tokyo (JP)

(72) Inventor: Jong Won Yun, Cheongju-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 131 days.

(21) Appl. No.: 17/110,683

(22) Filed: Dec. 3, 2020

(65) Prior Publication Data

US 2021/0090895 A1 Mar. 25, 2021

Related U.S. Application Data

(62) Division of application No. 14/883,738, filed on Oct. 15, 2015, now abandoned.

(30) Foreign Application Priority Data

Oct. 17, 2014 (KR) ......................... 10-2014-0140612

(51) Int. Cl.
*H01L 21/311* (2006.01)
*H01L 21/67* (2006.01)
*H01L 21/02* (2006.01)
*H01L 21/66* (2006.01)

(52) U.S. Cl.
CPC .. *H01L 21/31111* (2013.01); *H01L 21/02164* (2013.01); *H01L 21/02274* (2013.01); *H01L 21/31116* (2013.01); *H01L 21/6708* (2013.01); *H01L 21/67253* (2013.01); *H01L 22/20* (2013.01); *H01L 22/12* (2013.01)

(58) Field of Classification Search
None
See application file for complete search history.

(56) References Cited

U.S. PATENT DOCUMENTS

| 5,291,415 | A |   | 3/1994  | Zarowin et al. |
| 5,375,064 | A | * | 12/1994 | Bollinger ............. G05B 19/416 219/121.41 |
| 5,499,733 | A |   | 3/1996  | Litvak |
| 6,096,233 | A |   | 8/2000  | Taniyama et al. |

(Continued)

FOREIGN PATENT DOCUMENTS

| JP | 2004-335923 A | 11/2004 |
| JP | 2009-295649 A | 12/2009 |

(Continued)

*Primary Examiner* — Sylvia Macarthur
(74) *Attorney, Agent, or Firm* — Pearne & Gordon LLP (57) ABSTRACT

A substrate processing apparatus includes: a substrate holding unit configured to hold and rotate a substrate; an etching unit configured to etch a surface of a substrate by discharging a processing liquid to the substrate rotated by the substrate holding unit; and a control unit configured to control an etching amount by the etching unit. In the substrate processing apparatus, the control unit controls an etching amount at each position on the surface of the substrate based on information upon a characteristic of a surface processing to be performed on the substrate by a post-processing apparatus which is configured to perform a post-processing after a substrate processing by the substrate processing apparatus.

5 Claims, 8 Drawing Sheets

(56) References Cited

U.S. PATENT DOCUMENTS

| | | | |
|---|---|---|---|
| 6,409,879 B1* | 6/2002 | Toprac | H01L 29/66575 |
| | | | 118/698 |
| 6,461,878 B1* | 10/2002 | Lansford | H01L 21/31111 |
| | | | 257/E21.309 |
| 6,808,590 B1 | 10/2004 | Gotkis et al. | |
| 8,025,759 B2 | 9/2011 | Sasaki et al. | |
| 8,398,817 B2* | 3/2013 | Namba | H01L 21/0209 |
| | | | 156/345.55 |
| 8,696,863 B2* | 4/2014 | Higashijima | H01L 21/6708 |
| | | | 156/345.55 |
| 8,864,933 B2* | 10/2014 | Terada | H01L 21/31111 |
| | | | 156/345.52 |
| 2003/0196683 A1 | 10/2003 | Izumi et al. | |
| 2004/0206621 A1 | 10/2004 | Li et al. | |
| 2005/0000940 A1 | 1/2005 | Iwamoto et al. | |
| 2006/0226123 A1 | 10/2006 | Birang | |
| 2007/0231483 A1 | 10/2007 | Nanba et al. | |
| 2009/0291399 A1 | 11/2009 | Yamamoto | |
| 2009/0292491 A1 | 11/2009 | Fukuoka | |
| 2010/0029088 A1 | 2/2010 | Mayer et al. | |
| 2010/0181290 A1 | 7/2010 | Namba et al. | |
| 2013/0008601 A1 | 1/2013 | Andreas | |
| 2013/0171746 A1 | 7/2013 | Chang et al. | |
| 2014/0051258 A1* | 2/2014 | Izumoto | H01L 21/67086 |
| | | | 156/345.23 |
| 2014/0242731 A1* | 8/2014 | Mauer | G06F 30/00 |
| | | | 156/345.16 |
| 2014/0242804 A1 | 8/2014 | Ku et al. | |
| 2015/0093905 A1* | 4/2015 | Fujiwara | H01L 21/67051 |
| | | | 156/345.23 |
| 2015/0128994 A1 | 5/2015 | Kaneko et al. | |
| 2015/0140690 A1 | 5/2015 | Sakai et al. | |
| 2015/0140818 A1 | 5/2015 | Lee et al. | |
| 2015/0147829 A1 | 5/2015 | Benvegnu et al. | |
| 2015/0324970 A1 | 11/2015 | Iwanaga et al. | |
| 2016/0027696 A1 | 1/2016 | Nagaoka et al. | |
| 2016/0111296 A1 | 4/2016 | Yun | |
| 2021/0090895 A1* | 3/2021 | Yun | H01L 21/02164 |

FOREIGN PATENT DOCUMENTS

| | | | | |
|---|---|---|---|---|
| JP | 2013153141 A | * | 8/2013 | ............ B24B 37/04 |
| JP | 5565718 B2 | | 8/2014 | |
| KR | 10-2007-0097345 A | | 10/2007 | |
| TW | 284904 B | | 9/1996 | |
| TW | 346649 B | | 12/1998 | |
| WO | 2014/020642 A1 | | 2/2014 | |

* cited by examiner

SUBSTRATE PROCESSING APPARATUS, LINKED PROCESSING SYSTEM, AND SUBSTRATE PROCESSING METHOD

CROSS-REFERENCE TO RELATED APPLICATION

This is a divisional application of U.S. application Ser. No. 14/883,738 filed on Oct. 15, 2015, which claims the benefit of Korean Patent Application No. 2014-0140612 filed on Oct. 17, 2014, the entire disclosures of which are incorporated herein by reference.

TECHNICAL FIELD

The embodiments described herein pertain generally to a substrate processing apparatus, a substrate processing system and a substrate processing method for etching a film, which is formed on a substrate such as a semiconductor wafer, by using a processing liquid.

BACKGROUND

In general, in a manufacturing process for a semiconductor device, a thin film such as an oxide film or a nitride film as an insulating film is formed on a surface of a processing target substrate such as a semiconductor wafer. To form such a thin film, a chemical vapor deposition (CVD) method or the like is used. In this method, however, when a source gas is supplied from a lateral side of the substrate, it is highly likely that the substrate has an overall concave shape where a peripheral portion of the substrate is thicker than a central portion thereof. Meanwhile, in a film forming process by another method, the substrate may have a convex shape where a central portion thereof is thicker than a peripheral portion. Furthermore, in the manufacturing process for a semiconductor device, etching of the oxide film or the nitride film formed on the substrate is also performed by using an etching gas. In such a dry etching process using the etching gas, a central portion and a peripheral portion of the substrate may be non-uniformly etched depending on processing conditions, causing a problem that the film on the substrate may have a concave or convex profile after the etching.

As a technique to solve this problem, Patent Document 1 describes a liquid processing apparatus that planarizes a film formed on a substrate by supplying a processing liquid, for the uniformity of film thickness. This liquid processing apparatus is configured to equalize a film thickness of the substrate by measuring a film thickness profile on the substrate and controlling a movement of a processing liquid discharge nozzle and a discharge amount of the processing liquid based on the measured film thickness profile. In Patent Document 1, however, since the film thickness is attempted to be equalized only in consideration of the film thickness profile as a result of a prior process conducted before the processing liquid is discharged, the film thickness may become non-uniform again by a post-process which the substrate is subjected to after the substrate processing by the processing liquid. In the prior art, this problem could not be prevented.

Patent Document 1: Korean Patent Laid-open Publication NO. 2007-0097345

SUMMARY

In view of the foregoing, exemplary embodiments provide a technique whereby a finally produced film can be prevented from having a non-uniform thickness by controlling a wet etching amount at each position on a surface of a substrate based on a characteristic of a surface processing to be performed on the substrate in a post-processing apparatus.

In one exemplary embodiment, a substrate processing apparatus comprises: a substrate holding unit configured to hold and rotate a substrate; an etching unit configured to etch a surface of a substrate by discharging a processing liquid to the substrate rotated by the substrate holding unit; and a control unit configured to control an etching amount by the etching unit. In the substrate processing apparatus, the control unit controls an etching amount at each position on the surface of the substrate based on information upon a characteristic of a surface processing to be performed on the substrate by a post-processing apparatus which is configured to perform a post-processing after a substrate processing by the substrate processing apparatus.

In another exemplary embodiment, a linked processing system comprises: a pre-processing apparatus configured to perform a pre-processing on a surface of a substrate; a substrate processing apparatus configured to perform an etching processing on the surface of the substrate after the pre-processing; a post-processing apparatus configured to perform a post-processing on the surface of the substrate after the etching processing; and a host device connected to the pre-processing apparatus, the substrate processing apparatus and the post-processing apparatus. In the linked processing system, the host device acquires information upon a characteristic of a surface processing to be performed on the substrate by the post-processing apparatus, and sends the acquired information to a control unit within the substrate processing apparatus, and the control unit controls an etching amount at each position on the surface of the substrate in the substrate processing apparatus based on the information upon the characteristic of the surface processing to be performed on the substrate by the post-processing apparatus.

In yet another exemplary embodiment, a substrate processing method comprises: performing a pre-processing on a surface of a substrate; acquiring information upon a characteristic of a surface processing to be performed on the substrate in a post-processing after an etching processing; performing the etching processing on the surface of the substrate by discharging a processing liquid to the surface of the substrate while controlling an etching amount at each position on the surface of the substrate based on the information upon the characteristic of the surface processing in the post-processing; and performing the post-processing on the surface of the substrate after the etching processing.

According to the exemplary embodiments, by controlling a wet etching amount at each position on the surface of the substrate based on the characteristic of the surface processing to be conducted on the substrate in the post-processing apparatus, a film thickness can be equalized effectively across the entire surface of the finally produced substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following, exemplary embodiments will be described in detail so that inventive concept may be readily implemented by those skilled in the art. However, it is to be noted that the present disclosure is not limited to the exemplary embodiments and examples but can be realized in various other ways. In drawings, parts not directly relevant to the description are omitted to enhance the clarity of the drawings, and like reference numerals denote like parts through the whole document.

Still, the exemplary embodiments described in the detailed description, drawings, and claims are not meant to be limiting. Other embodiments may be utilized, and other changes may be made, without departing from the spirit or scope of the subject matter presented herein. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

Hereafter, exemplary embodiments will be described in detail with reference to the accompanying drawings, which form a part of the description.

Figure 1:
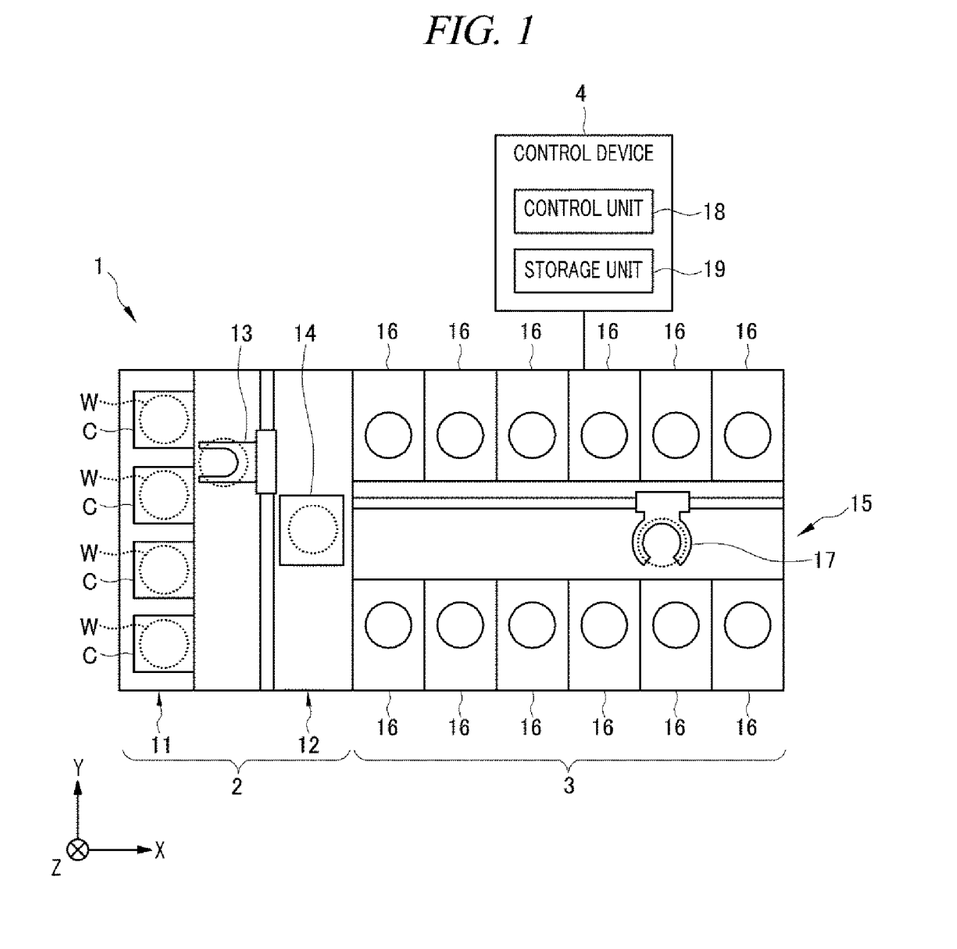
FIG. 1 is a plane view of a substrate processing system according to an exemplary embodiment.

FIG. 1 is a plan view illustrating an outline of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of wafers horizontally.

The transfer section 12 is provided adjacent to the carrier placing section 11, and provided with a substrate transfer device 13 and a delivery unit 14. The substrate transfer device 13 is provided with a substrate holding mechanism configured to hold the wafer W. Further, the substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
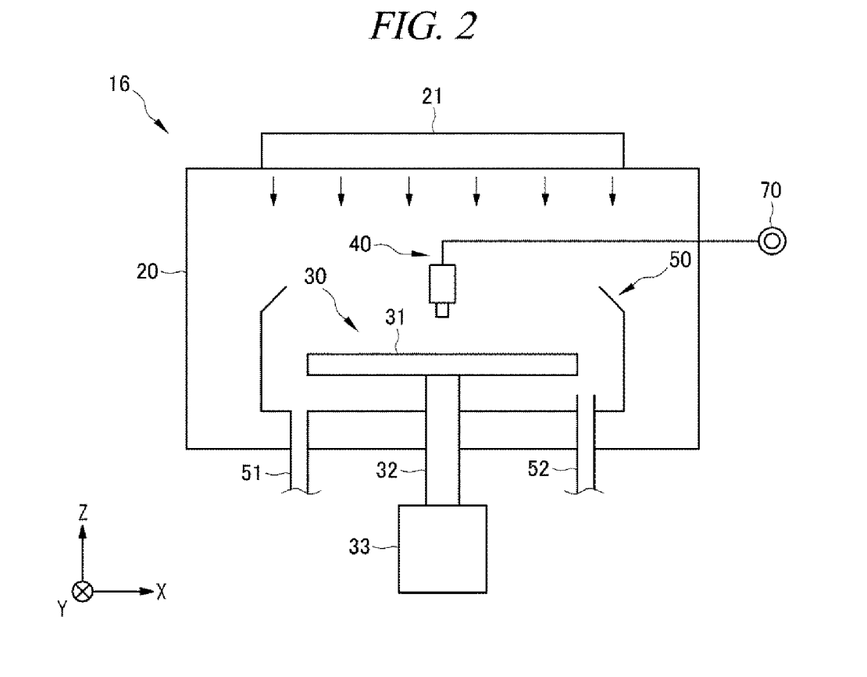
FIG. 2 is a side view illustrating a processing unit according to an exemplary embodiment.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
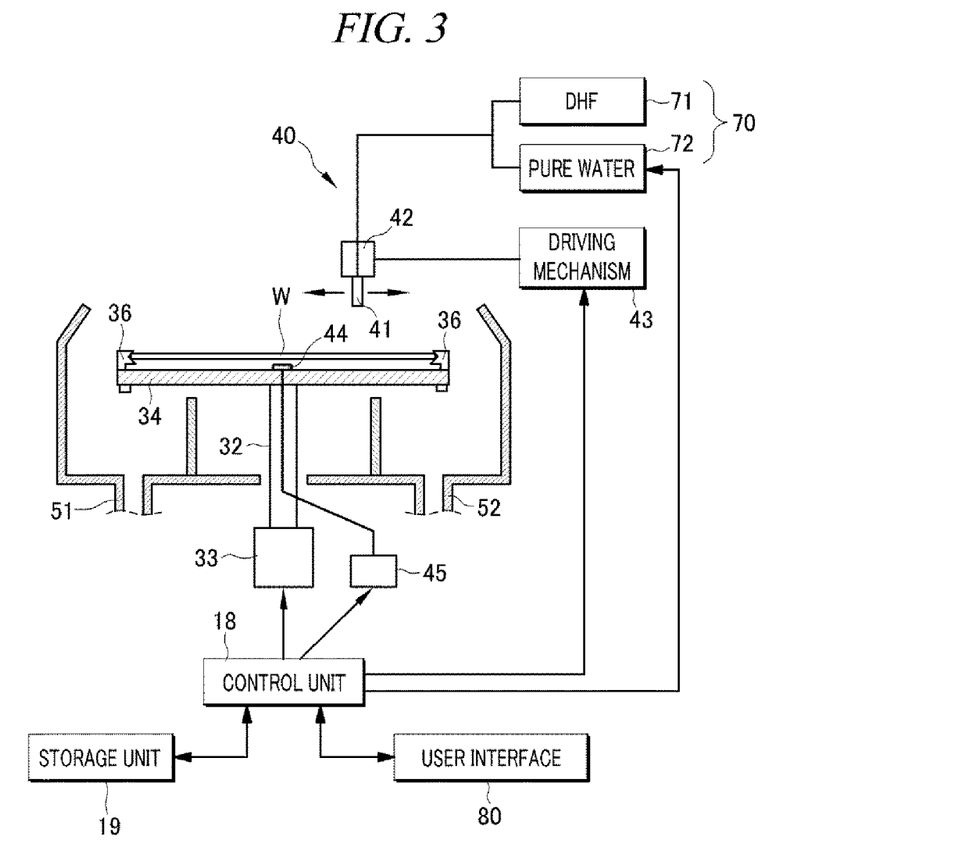
FIG. 3 is side view illustrating an internal configuration of a chamber of a processing unit according to an exemplary embodiment.

The processing unit 16 according to the present exemplary embodiment is a wet etching unit which supplies a processing liquid onto an oxide film or a nitride film formed on the wafer W while rotating the wafer W, to thereby dissolve the film. FIG. 3 is a diagram that provides a detailed illustration of an internal configuration of a chamber 20 of the processing unit 16.

The holding unit 31 includes a rotary plate 34 and a multiple number of holding pins 36 for holding the wafer W.

The processing fluid supply unit 40 is equipped with a processing liquid discharge nozzle 41 configured to be movable between a central portion and a peripheral portion of the wafer W. The processing liquid discharge nozzle 41 is capable of discharging diluted hydrofluoric acid (DHF) as a processing liquid and pure water as a rinse liquid selectively. The processing liquid discharge nozzle 41 is connected to the processing fluid source 70 via a nozzle holder 42. The processing fluid source 70 includes a DHF source 71 and a pure water source 72, and operates the DHF source 71 and the pure water source 72 selectively. Further, the processing liquid discharge nozzle 41 is connected to a driving mechanism 43 and configured to be linearly movable between the central portion and the peripheral portion of the wafer W.

Further, a fluid discharge unit 44 is provided on a rear surface side of the wafer W to discharge to a fluid having a higher temperature than the processing liquid to a center of a rear surface of the wafer W. The fluid discharge unit 44 is capable of controlling a temperature of the central portion of the wafer W by discharging the high-temperature fluid supplied from a high-temperature fluid source 45. In the present exemplary embodiment, heated pure water is used as the high-temperature fluid. However, a high-temperature inert gas such as nitrogen may be utilized instead.

As depicted in FIG. 3, individual components of the processing unit 16 are connected to and controlled by the control unit 18 of the control device 4. The control unit 18 is connected to a user interface 80 provided with a display that visually displays an operational status of each component of the processing unit 16, and also connected to a storage unit 19 that stores therein information required for control operations.

Figure 4:
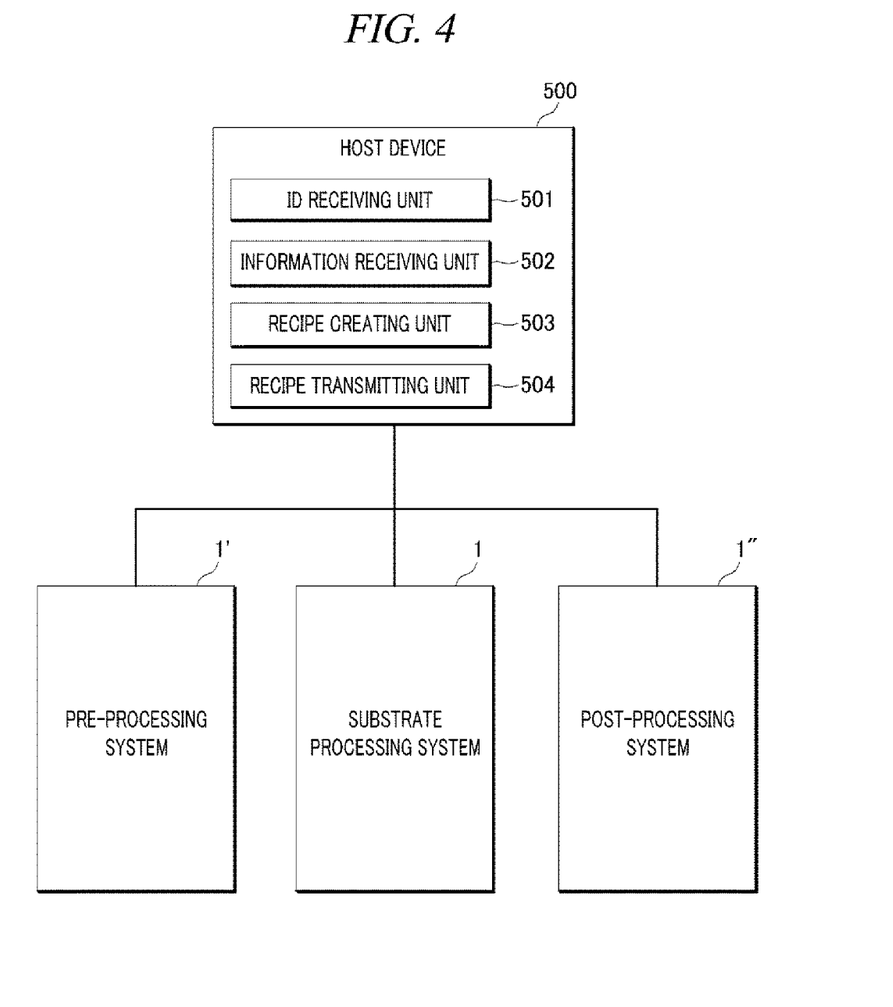
FIG. 4 is a conceptual diagram illustrating a linked processing system according to an exemplary embodiment.

FIG. 4 illustrates a linked processing system according to an exemplary embodiment. As illustrated in FIG. 4, the linked processing system according to the exemplary embodiment includes, in addition to the substrate processing system 1 described above, a pre-processing system 1' configured to perform a processing on a wafer W prior to a wet-etching processing and a post-processing system 1" configured to perform a processing on the wafer W after the wet-etching processing. Further, the pre-processing system 1', the substrate processing system 1 and the post-processing system 1" are linked to a host device 500 on a network.

The host device 500 is equipped with an ID receiving unit 501 for receiving an ID of a wafer W of the substrate processing system 1; an information receiving unit 502 for acquiring information upon a characteristic of a surface processing on a substrate corresponding to the certain ID in a pre-processing and/or in a post processing; a recipe creating unit 503 for creating a recipe suitable for the characteristic of the surface processing; and a recipe transmitting unit 504 for transmitting the corresponding recipe to the substrate processing system 1.

With the above-described configuration, the ID of the wafer W held on the holding unit 31 within the processing unit 16 of the substrate processing system 1 is sent to the host device 500. The host device 500 then acquires, from the pre-processing system 1' and/or the post-processing system 1", the information upon the characteristic of the pre-processing and/or the post-processing corresponding to the received ID, and creates a recipe suitable for the characteristic of the surface processing and sends the created recipe to the substrate processing system 1. Here, the recipe based on the characteristic of the pre- and/or post-processing may be produced just by using a tendency of a film thickness profile on the wafer W or by accurate calculation using specific data of film thicknesses at individual positions on the surface of the wafer W.

Accordingly, the way to perform the wet etching processing in the processing unit 16 of the substrate processing system 1 can be changed based on the characteristic of the post-processing in the post-processing system 1". Also, the way to perform the wet etching processing in the processing unit 16 of the substrate processing system 1 can be changed based on the characteristics of both the pre-processing and the post-processing in the pre-processing system 1' and the post-processing system 1".

By way of example, a wafer surface processing of the post-processing system 1" corresponding to the ID of the wafer W is characterized in that a film thickness at a peripheral portion of the wafer W is thicker than a film thickness at a central portion thereof (i.e., the wafer W would have a concave profile), the host device 500 receives information upon this characteristic from the post-processing system 1", creates a recipe whereby a film profile after the post-processing can be uniformed, and sends the created recipe to the storage unit 19 of the substrate processing system 1. In this case, the suitable recipe may be one that allows an etching amount at the central portion of the wafer W to be decreased and an etching amount at the peripheral portion of the wafer W to be increased. The control unit 18 controls the processing unit 16 to execute the corresponding recipe stored in the storage unit 19. To elaborate, under the control of the control unit 18, a discharge of the processing liquid from the processing liquid discharge nozzle 41 is started at a position which is spaced apart from the center of the wafer W by a preset distance, for example, about 50 mm, and the processing liquid discharge nozzle 41 is moved toward the center of the wafer W. Through this control, the etching amount at the central portion of the wafer W can be made smaller than the etching amount at the peripheral portion of the wafer W.

Furthermore, if a wafer surface processing of the post-processing system 1" corresponding to the ID of the wafer W is characterized in that a film thickness at a central portion of the wafer W is thicker than a film thickness at a peripheral portion thereof (i.e., the wafer would have a convex profile), the host device 500 receives information upon this characteristic from the post-processing system 1", creates a recipe whereby a film profile after the post-processing can be uniformed, and sends the created recipe to the storage unit 19 of the substrate processing system 1. In this case, the suitable recipe may be one that allows an etching amount at the central portion of the wafer W to be increased and an etching amount at the peripheral portion of the wafer W to be decreased. The control unit 18 controls the processing unit 16 to execute the corresponding recipe stored in the storage unit 19. To elaborate, the control unit 18 controls the processing liquid discharge nozzle 41 to discharge the processing liquid to the center of the wafer W and the fluid discharge unit 44 to discharge the high-temperature fluid to the center of the rear surface of the wafer W, thus allowing the etching amount at the central portion of the wafer W to become larger than the etching amount at the peripheral portion thereof.

According to the present exemplary embodiment, the individual processing systems are linked to the host device 500 on the network, and the substrate processing system 1 is controlled through the network. If, however, recipes are previously stored in the storage unit 19, the recipes can be read out from the storage unit 19 without having to be received through the network. In such a case, a user can directly select a recipe among recipes stored in the storage unit 19 by manipulating the control unit 18 of the processing unit 16 of the substrate processing system 1, thus allowing a substrate processing to be performed in the processing unit 16.

Hereinafter, a configuration of the pre-processing system 1' and the post-processing system 1" will be discussed in detail.

The pre-processing system 1' and the post-processing system 1" have substantially the same configuration as that of the substrate processing system 1 shown in FIG. 1 except that the pre-processing system 1' and the post-processing unit 1" has a pre-processing unit and a post-processing unit, respectively, instead of the substrate processing unit 16.

Figure 5A:
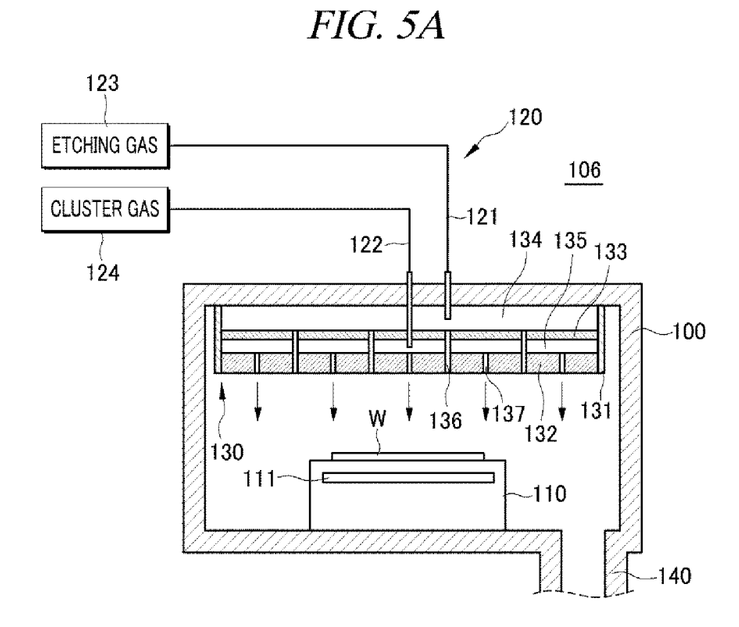
FIG. 5A and FIG. 5B are side views illustrating processing units of a pre-processing system and a processing unit of a post-processing system according to an exemplary embodiment.

Each of the pre-processing unit and the post-processing unit may be a dry etching unit 106, as depicted in FIG. 5A. The dry etching unit 106 may be implemented by a dry etching apparatus having a chamber 100, a mounting table 110, a gas supply mechanism 120 and a shower head 130.

A temperature controller 111 is embedded in the mounting table 110 that sustains a wafer W thereon. The temperature controller 111 adjusts a temperature of the mounting table 110 according to a characteristic of a processing involved.

The shower head 130 is provided at a top portion of the chamber 100, facing the mounting table 110. The shower head 130 includes a main body 131 and a shower plate 132, and a space confined by the main body 131 and the shower plate 132 is divided into a first space 134 and a second space 135 by a plate 133. The first space 134 communicates with a plurality of first gas discharge holes 136 formed in the shower plate 132, and the second space 135 communicates with a multiple number of second gas discharge holes 137 formed in the shower plate 132.

The gas supply mechanism 120 is equipped with a first gas supply line 121 and a second gas supply line 122, and also provided with an etching gas source 123 and a cluster gas source 124 connected to the first gas supply line 121 and the second gas supply line 122, respectively. A mixture of a HF gas and an Ar gas as a dilution gas may be used as an etching gas.

The etching gas is discharged into the chamber 100 from the first gas discharge holes 136 after passing through the first gas supply line 121 and the first space 134, and a cluster gas is discharged into the chamber 100 from the second gas discharge holes 137 after passing through the second gas supply line 122 and the second space 135. An exhaust port 140 is formed in a bottom of the chamber 100 to evacuate the chamber 100.

Figure 5B:
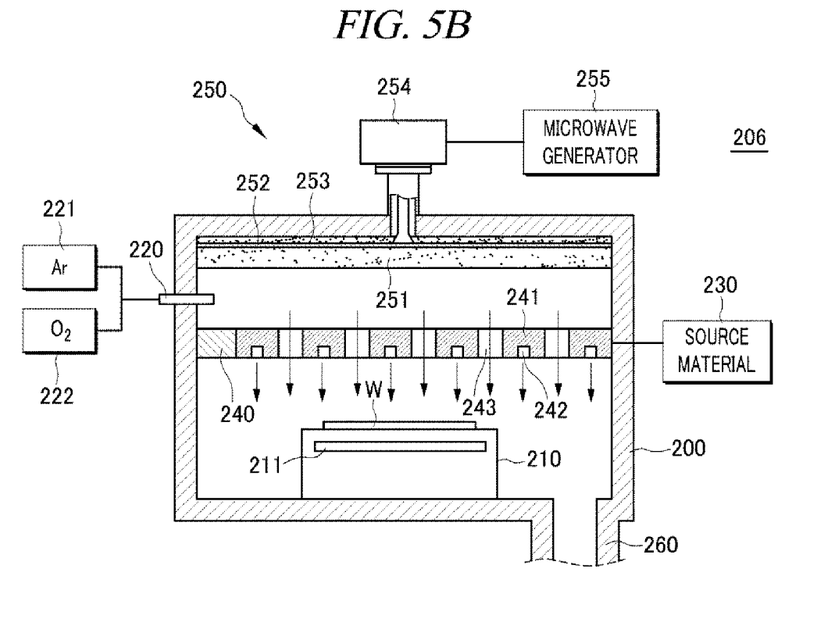

Each of the pre-processing unit and the post-processing unit may also be configured as a film forming unit 206, as depicted in FIG. 5B. The film forming unit 206 may be implemented by a microwave plasma CVD film forming apparatus having a chamber 200, a mounting table 210, a plasma gas introducing member 220, a source gas source 230, a shower plate 240 and a microwave introducing unit 250.

A temperature controller 211 is embedded in the mounting table 210 that sustains a wafer W thereon. The temperature controller 211 adjusts a temperature of the mounting table 110 according to a characteristic of a processing involved.

The microwave introducing unit 250 is provided with a microwave transmitting plate 251, a planar antenna 252 and a wavelength shortening member 253, and configured to introduce a microwave generated from a microwave generator 255 into a processing space within the chamber 200 via a waveguide 254.

A shower plate 240 for introducing a source gas for forming a silicon oxide film is horizontally provided between the microwave introducing unit 250 and the mounting table 210 within the chamber 200. The shower plate 240 is provided with gas discharge holes 242 formed in gas flow paths 241 which are arranged with gaps 243 therebetween.

The source gas source 230 for supplying the source gas for forming a silicon oxide film is connected to the gas flow paths 241 of the shower plate 240, and the source gas is introduced into the chamber 200 through the gas discharge holes 242 via the gas flow paths 241 of the shower plate 240.

The plasma gas introducing member 220 is provided along a chamber wall at a position above the shower plate 240. The plasma gas introducing member 220 is connected to an Ar gas supply source 221 and an $O_2$ gas supply source 222, and introduces an Ar gas and an $O_2$ gas into the chamber 200. An exhaust port 260 is formed in a bottom of the chamber 200 to evacuate the chamber 200.

The Ar gas and the $O_2$ gas introduced into the chamber 200 from the Ar gas supply source 221 and the $O_2$ gas supply source 222 are excited into plasma by a microwave, and the thus generated plasma passes through the gaps 243 of the shower plate 240 and reacts on the source gas for a silicon oxide film discharged from the gas discharge holes 242 of the shower plate 240, so that a film formation is performed on the wafer W.

In the pre- or post-processing, a profile of a produced film may be determined based on a characteristic of a dry etching processing by the dry etching unit 106 or a film forming processing by the film forming unit 206. To elaborate, a profile of a film on a wafer surface may vary depending on a supply mechanism of an etching gas or a film forming gas, and, also, depending on processing conditions such as an internal pressure of the chamber, a temperature of the mounting table, and so forth.

The profile of the film may have, by way of example, a convex shape where a film thickness at a central portion of the wafer is larger than a film thickness at a peripheral portion thereof, or a concave shape where a film thickness at the central portion of the wafer is smaller than a film thickness at the peripheral portion. However, the profile of the film may not be limited to these shapes but may have various other shapes.

In the present exemplary embodiment, a movement of the nozzle and a feed amount of the processing liquid in the wet etching processing is controlled based on information upon a film profile in a post-processing for the dry-etching processing or the film forming processing, or based on information upon film profiles both in a pre-processing and in the post-processing for the dry etching processing or the film forming processing.

Below, principles of film thickness equalization according to the exemplary embodiment will be explained in comparison with the prior art stated above.

In the prior art, it is attempted to equalize a film thickness by controlling an etching amount at each position on a surface of a wafer during a wet etching processing based on a profile of a film produced prior to the wet etching process. Thus, the film thickness may become non-uniform again by a post-processing.

Figure 6A:
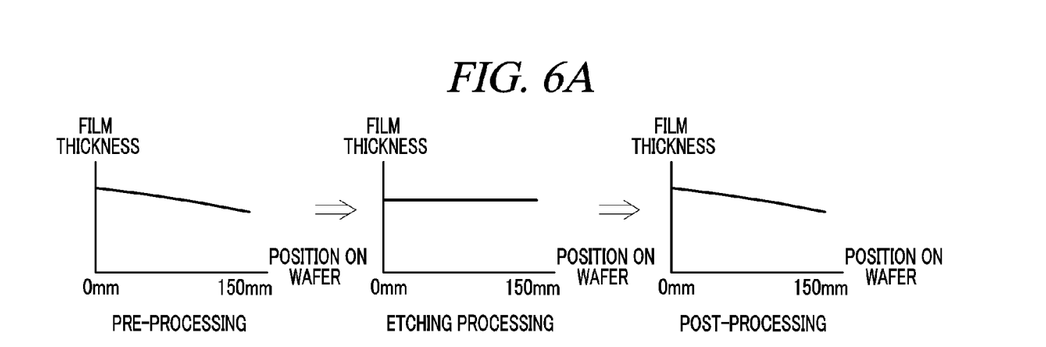
FIG. 6A to FIG. 6D are graphs showing a variation in a film profile in individual processes in the prior art.
Figure 6B:
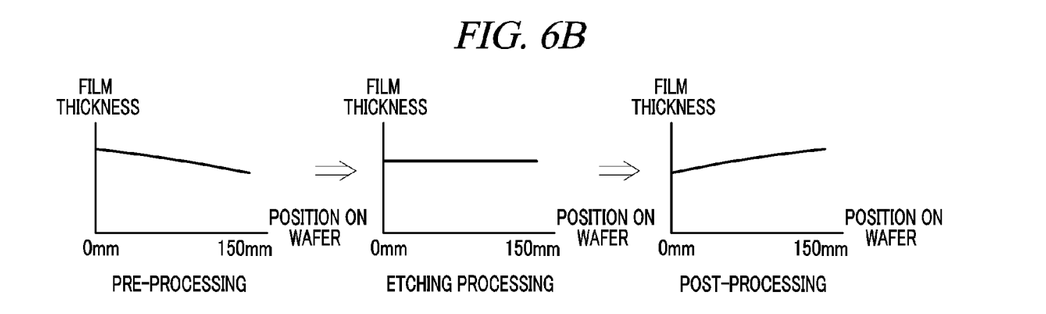
Figure 6C:
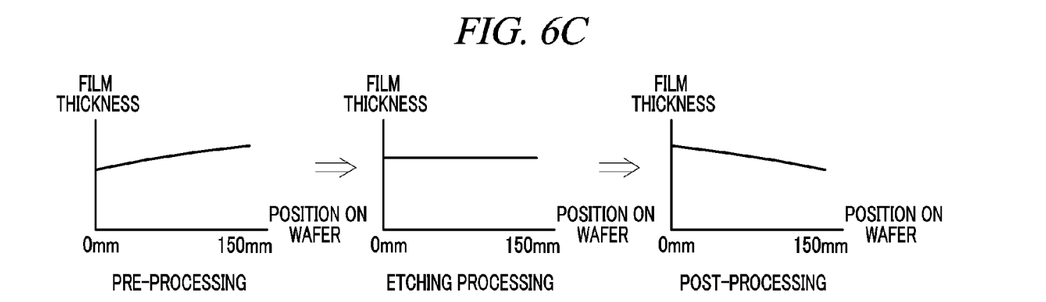
Figure 6D:
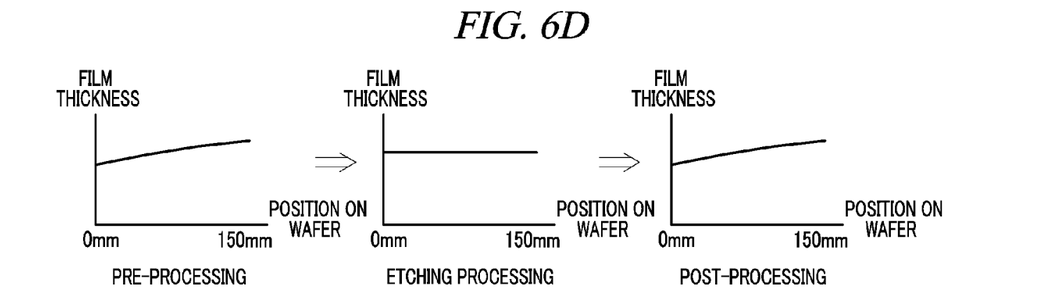

FIG. 6A to FIG. 6D show a variation in a film profile on a wafer according to the prior art. Each graph represents a film profile ranging from a central portion (0 mm) to a peripheral portion (150 mm) of a wafer W (having a diameter of 300 mm). FIG. 6A illustrates a case where both a pre-processing and a post-processing have a characteristic of producing a film profile of a convex shape where a central portion of the wafer is thicker than a peripheral portion thereof. FIG. 6B illustrates a case where a pre-processing has a characteristic of producing a film profile of a convex shape and a post-processing has a characteristic of producing a film profile of a concave shape; FIG. 6C illustrates a case where a pre-processing has a characteristic of producing a film profile of a concave shape and a post-processing has a characteristic of producing a film profile of a convex shape; and FIG. 6D illustrates a case where both a pre-processing and a post-processing have a characteristic of producing a film profile of a concave shape.

As can be seen from FIG. 6A to FIG. 6D, although the film thickness can be equalized by the wet-etching process in each case, the film profile on the surface of the wafer becomes non-uniform again, having a convex shape or a concave shape again according to the characteristic of the post-processing after the wet etching processing.

In comparison, according to an exemplary embodiment, an etching amount at each position on a surface of a wafer in a wet etching processing is controlled based on information upon a characteristic of a post-processing to be performed after the wet-etching processing.

Figure 7A:
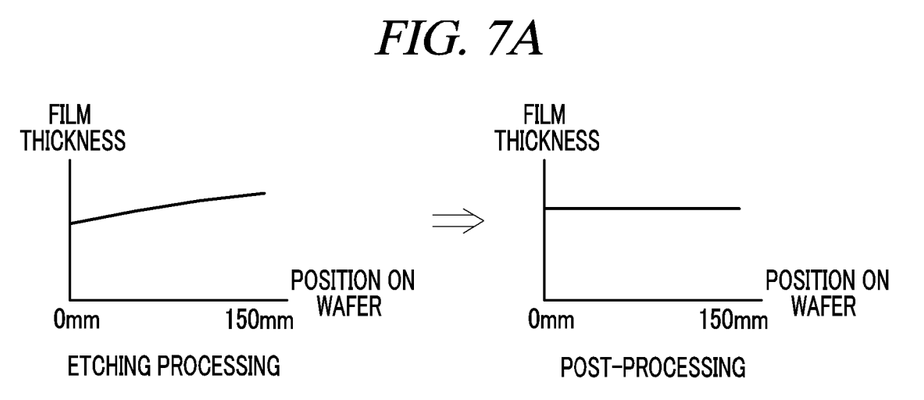
FIG. 7A and FIG. 7B are graphs for describing a variation in a film profile in individual processes according to an exemplary embodiment.
Figure 7B:
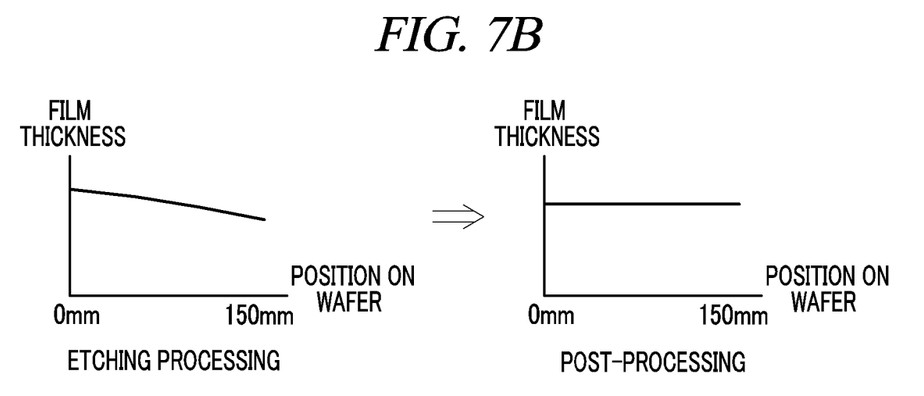

FIG. 7A illustrates a case where a profile of a finally produced film is made uniform across the entire surface of a wafer by controlling an etching profile of the wet etching process to have a concave shape when the post-processing has a characteristic of producing a convex profile. FIG. 7B shows a case where a profile of a finally produced film is made uniform by controlling an etching profile of the wet etching process to have a convex shape when the post-processing has a characteristic of producing a concave profile.

Furthermore, according to an exemplary embodiment, an etching amount at each position on a surface of a wafer in the wet-etching processing is controlled in consideration of characteristics of both the pre-processing and the post-processing. FIG. 8A to FIG. 8D depict examples of controlling an etching amount at each position on the surface of the wafer based on the characteristics of both the pre-processing and the post-processing such that a profile of a finally produced film is equalized across the entire surface of the wafer.

Figure 8A:
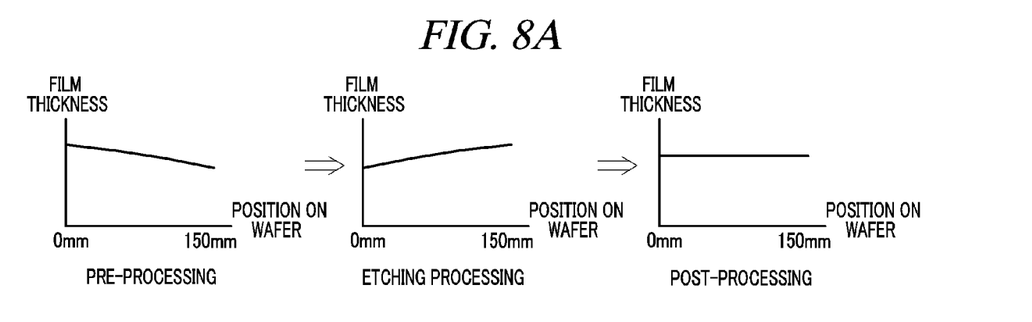
FIG. 8A to FIG. 8D are graphs for describing a variation in a profile of a film in individual processes according to an exemplary embodiment.
Figure 8B:
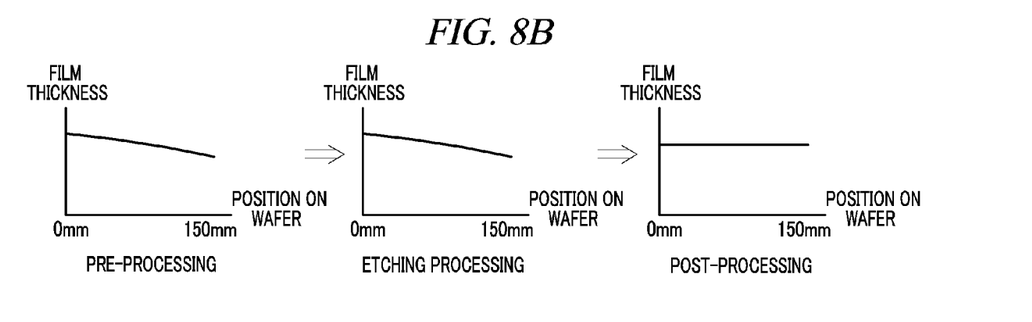
Figure 8C:
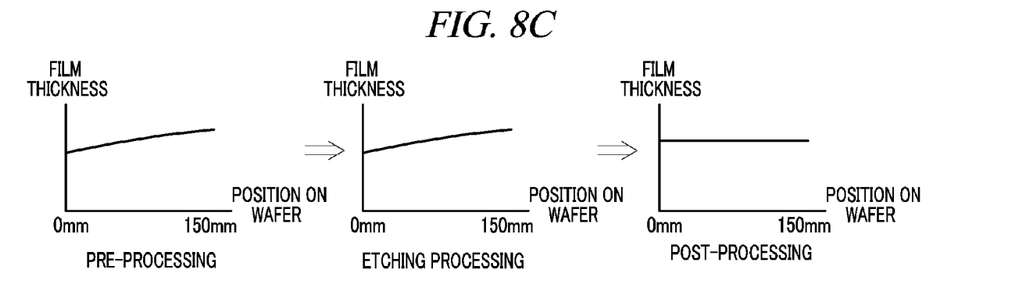

FIG. 8A illustrates a case where both the pre-processing and the post-processing have a characteristic of producing a convex profile; FIG. 8B illustrates a case where the pre-processing has a characteristic of producing a convex profile and the post-processing has a characteristic of producing concave profile; FIG. 8C illustrates a case where the pre-processing has a characteristic of producing a concave profile and the post-processing has a characteristic of producing a convex profile; and FIG. 8D illustrates a case where both the pre-processing and the post-processing have a characteristic of producing a concave profile.

Figure 8D:
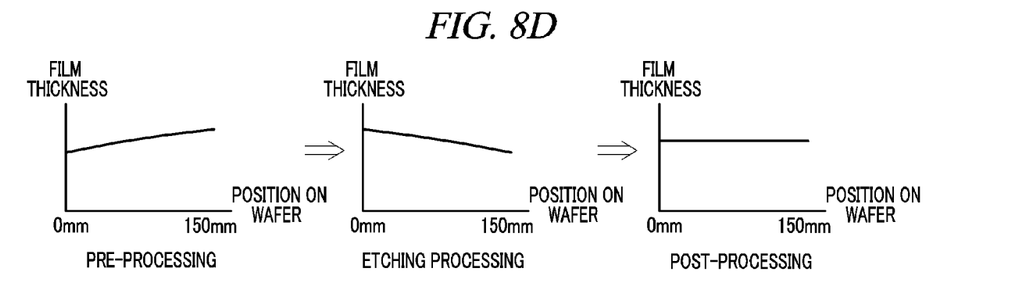

In FIG. 8A to FIG. 8D, the characteristic of the pre-processing is additionally considered, as compared to FIG. 7A to FIG. 7D. For example, as shown in FIG. 8A, when both the pre-processing and the post-processing have a characteristic of producing a convex profile, the etching amount may be controlled in the wet etching processing to have an etching profile whereby a central portion of the wafer is more recessed than that in the wet-etching process of FIG. 7A (that is, an etching amount at the central portion of the wafer becomes larger than that in the wet-etching process of FIG. 7A). Meanwhile, as shown in FIG. 8D, when both the pre-processing and the post-processing have a characteristic of producing a concave profile, the etching amount may be controlled in the wet etching process to have an etching profile whereby a central portion of the wafer is more protruded than that in the wet etching process of FIG. 7B (that is, an etching amount at the central portion of the wafer becomes smaller than that in the wet-etching process of FIG. 7B).

As stated above, by controlling the etching amount at each position on the surface of the wafer in the wet etching process in consideration of the characteristic of the post-processing or the characteristics of both the pre-processing and the post-processing, a profile of a finally produced film can be equalized across the entire surface of the wafer W. Therefore, a yield of produced semiconductor device products can be greatly improved.

In the above-described exemplary embodiment, the "characteristic of a surface processing" is specified from a result, such as a film thickness profile, obtained after the surface processing is conducted. However, the characteristic of the surface processing is not limited thereto and may be specified by a performance of an apparatus, such as an etching amount and a film forming rate. Further, the "information upon the characteristic of a surface processing" implies information including at least one of a performance of an apparatus that performs the surface processing, a film thickness profile of a substrate processed by the apparatus and a recipe created based on the film thickness profile.

Accordingly, the "information upon the characteristic of a surface processing" of the pre-processing apparatus and the post-processing apparatus, which is acquired by the substrate processing apparatus, is not limited to the recipe as presented as an example in the above-described embodiment but may be information upon a performance of the apparatus that performs the surface processing or a film thickness profile. In such a case, the substrate processing apparatus acquires information upon the performance of the apparatus that performs the surface processing or information upon the film thickness profile, and, based on this information, calculates an etching amount that allows a film thickness of the substrate to be equalized. Then, the substrate processing apparatus controls an etching processing based on the calculated etching amount.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing method, comprising:
performing a pre-processing on a surface of a substrate;
acquiring information upon a characteristic of a surface processing to be performed on the substrate in a post-processing after an etching processing;
performing the etching processing on the surface of the substrate by discharging a processing liquid to the surface of the substrate while controlling an etching amount at each position on the surface of the substrate based on the information upon the characteristic of the surface processing in the post-processing; and
performing the post-processing on the surface of the substrate after the etching processing,
wherein when the information upon the characteristic of the surface processing to be performed on the substrate in the post-processing indicates that a film thickness at a central portion of the substrate is smaller than a film thickness at a peripheral portion thereof, the step of performing of the etching processing comprises:
starting a discharge of the processing liquid from a position spaced apart from a center of the substrate by a preset distance; and
moving a nozzle, which discharges the processing liquid, toward the center of the substrate.

2. The substrate processing method of claim 1,
wherein
the step of performing the etching processing on the surface of the substrate comprises controlling an etching amount at the central portion of the substrate to be decreased and an etching amount at the peripheral portion of the substrate to be increased based on the information upon the characteristic of the surface processing in the post-processing.

3. The substrate processing method of claim 1,
wherein the surface processing to be performed on the substrate in the post-processing is a dry etching processing.

4. The substrate processing method of claim 1,
wherein the surface processing to be performed on the substrate in the post-processing is a film forming processing.

5. The substrate processing method of claim 1,
wherein the step of performing the etching processing on the surface of the substrate comprises controlling the etching amount at each position on the substrate based on information upon a characteristic of a surface processing performed on the substrate in the pre-processing and based on the information upon the characteristic of the surface processing to be performed on the substrate in the post-processing.

* * * * *